United States Patent
Oshiyama et al.

(10) Patent No.: US 8,508,634 B2
(45) Date of Patent: Aug. 13, 2013

(54) SOLID-STATE IMAGE PICKUP ELEMENT AND A METHOD OF MANUFACTURING THE SAME, AND IMAGE PICKUP DEVICE INCLUDING THE SAME

(75) Inventors: Itaru Oshiyama, Kumamoto (JP); Eiji Miyata, Fukuoka (JP)

(73) Assignee: Sony Corporation, Tokyo (JP)

( * ) Notice: Subject to any disclaimer, the term of this patent is extended or adjusted under 35 U.S.C. 154(b) by 402 days.

(21) Appl. No.: 12/820,796

(22) Filed: Jun. 22, 2010

(65) Prior Publication Data
US 2011/0025872 A1 Feb. 3, 2011

(30) Foreign Application Priority Data

Aug. 3, 2009 (JP) ................. 2009-180901

(51) Int. Cl.
*H04N 3/14* (2006.01)
*H04N 5/228* (2006.01)
*H04N 9/73* (2006.01)

(52) U.S. Cl.
USPC ...................... 348/294; 348/222.1; 348/224.1

(58) Field of Classification Search
None
See application file for complete search history.

(56) References Cited

U.S. PATENT DOCUMENTS

| | | | | |
|---|---|---|---|---|
| 2009/0078990 | A1* | 3/2009 | Yasuda | 257/326 |
| 2010/0051943 | A1* | 3/2010 | Fujii | 257/43 |
| 2010/0224946 | A1* | 9/2010 | Oshiyama et al. | 257/432 |
| 2011/0031376 | A1* | 2/2011 | Oshiyama et al. | 250/208.1 |
| 2011/0140209 | A1* | 6/2011 | Wang et al. | 257/414 |
| 2011/0164159 | A1* | 7/2011 | Ohgishi | 348/298 |
| 2011/0223707 | A1* | 9/2011 | Hynecek et al. | 438/70 |
| 2011/0260222 | A1* | 10/2011 | Beak et al. | 257/291 |
| 2012/0147241 | A1* | 6/2012 | Yamaguchi et al. | 348/311 |
| 2012/0228473 | A1* | 9/2012 | Yoshitsugu | 250/208.1 |

FOREIGN PATENT DOCUMENTS

| | | |
|---|---|---|
| JP | 2005-123280 | 5/2005 |
| JP | 2008-306154 | 12/2008 |

\* cited by examiner

*Primary Examiner* — Lin Ye
*Assistant Examiner* — John H Morehead, III
(74) *Attorney, Agent, or Firm* — Robert J. Depke; The Chicago Technology Law Group, LLC

(57) ABSTRACT

Disclosed herein is a solid-state image pickup element, including: a semiconductor layer in which a photodiode for carrying out photoelectric conversion is formed; a first film containing negative fixed charges and formed on the semiconductor layer in a region in which at least the photodiode is formed by utilizing either an atomic layer deposition method or a metal organic chemical vapor deposition method; a second film containing the negative fixed charges and formed on the first film containing therein the negative fixed charges by utilizing a physical vapor deposition method; and a third film containing the negative fixed charges and formed on the second film containing therein the negative fixed charges by utilizing either the atomic layer deposition method or the metal organic chemical vapor deposition method.

7 Claims, 7 Drawing Sheets

SOLID-STATE IMAGE PICKUP ELEMENT AND A METHOD OF MANUFACTURING THE SAME, AND IMAGE PICKUP DEVICE INCLUDING THE SAME

The present application claims priority to Japanese Patent Application JP 2009-180901 filed in the Japanese Patent Office on Aug. 3, 2009, the entire content of which is hereby incorporated by reference.

BACKGROUND OF THE INVENTION

1. Field of the Invention

The present invention relates to a solid-state image pickup element and a method of manufacturing the same, and an image pickup device including the same.

2. Description of the Related Art

In a CCD (Charge Coupled Device) solid-state image pickup element and a CMOS (Complementary Metal Oxide Semiconductor) solid-state image pickup element, it is known that crystal defects generated in a photodiode, and interface states generated in an interface between a light receiving portion formed in a silicon substrate, and an insulating layer overlying the light receiving portion cause a dark current.

FIG. 13A is a schematic cross sectional view showing a state in which an insulating layer is formed on a silicon layer having a photodiode formed therein, and FIG. 13B is an energy diagram of the insulating layer and the silicon layer shown in FIG. 13A. Thus, as shown in FIGS. 13A and 13B, interface states each indicated by a mark x are generated in an interface between the silicon layer 51 having the photodiode formed therein, and the insulating layer 52 overlying the silicon layer 51. Each of these interface states becomes a generation source of the dark current, and thus electrons each resulting from the interface are caused in the form of the dark current to flow into the photodiode PD.

Then, a so-called Hole Accumulation Diode (HAD) structure is adopted as a technique for suppressing the generation of the dark current. The HAD structure, for example, is described in Japanese Patent Laid-Open No. 2005-123280 (referred to as Patent Document 1 hereinafter).

FIG. 14A is a schematic cross sectional view explaining the case where a $p^+$-type semiconductor region is formed to obtain the HAD structure, and FIG. 14B is an energy diagram of the silicon layer, the insulating layer, and a positive charge accumulation region formed between the silicon layer and the insulating layer. Specifically, as shown in FIGS. 14A and 14B, a p-type impurity is introduced into the vicinity of a surface of the silicon layer 51 to form the $p^+$-type semiconductor region, and the resulting $p^+$-type semiconductor region is made the positive charge accumulation region 53 for accumulating therein positive charges (holes).

The HAD structure in which the positive charge accumulation region 53 is formed in the interface between the silicon layer 51 and the insulating layer 52 is obtained in the manner as described above, whereby the photodiode is kept clear of the interface, thereby making it possible to suppress the generation of the dark current from the interface states each serving as the generation source.

In general, in forming the HAD structure, ions of B, $BF_2$ or the like are implanted into the silicon layer at an annealing temperature, thereby forming the $p^+$-type semiconductor region becoming the positive charge accumulation region 53 in the vicinity of the interface.

Also, for the purpose of realizing the proper diffusion and activation of the implanted impurity ions, it is essential to the existing ion implantation process to hold a high temperature for as long as possible.

However, holding the high temperature for a long time is not desirable from a viewpoint of sufficiently ensuring the characteristics and the like of the solid-state image pickup element.

In order to cope with this situation, as shown in FIGS. 15A and 15B, it is proposed that an insulating layer 55 containing therein negative fixed charges 54 is formed as the insulating layer formed so as to overlie the silicon layer 51 having the photodiode PD formed therein instead of forming the normal insulating layer 52. This structure, for example, is described in Japanese Patent Laid-Open No. 2008-306154 (referred to as Patent Document 2 hereinafter).

In this case, as shown in FIG. 15B, even when the impurity ions are not implanted into the silicon layer 51, the positive charge accumulation region 53 is formed in the vicinity of the interface between the silicon layer 51 and the insulating layer 55 by bending the energy band of the insulating layer 55, thereby allowing the positive charges (holes) to be accumulated in the positive charge accumulation region 53.

$HfO_2$, $ZrO_2$, $Al_2O_3$, $TiO_2$, $Ta_2O_5$ or the like is given as the material for such an insulating layer 55 containing therein the negative fixed charges 54.

SUMMARY OF THE INVENTION

Patent Document 2 also proposes a technique with which in depositing the insulating layer containing therein the negative fixed charges, a first film deposited by utilizing either an Atomic Layer Deposition (ALD) method or a Metal Organic Chemical Vapor Deposition (MOCVD) method, and a second film deposited by utilizing a Physical Vapor Deposition (PVD) method are laminated one upon another.

According to this technique, the generation of the interface states can be suppressed by utilizing the ALD method, and the productivity can be enhanced by utilizing the PVD method.

However, it is desired to further suppress the generation of the dark current caused by the interface states as compared with the case of the structure described in Patent Document 2.

The present invention has been made in order to solve the problems described above, and it is therefore desire to provide a solid-state image pickup element in which a dark current can be suppressed and a method of manufacturing the same, and an image pickup device including the same.

In order to attain the desire described above, according to an embodiment of the present invention, there is provided a solid-state image pickup element including: a semiconductor layer in which a photodiode for carrying out photoelectric conversion is formed; a first film containing therein negative fixed charges and formed on the semiconductor layer in a region in which at least the photodiode is formed by utilizing either an atomic layer deposition method or a metal organic chemical vapor deposition method; a second film containing therein the negative fixed charges and formed on the first film containing therein the negative fixed charges by utilizing a physical vapor deposition method; and a third film containing therein the negative fixed charges and formed on the second film containing therein the negative fixed charges by utilizing either the atomic layer deposition method or the metal organic chemical vapor deposition method.

In the solid-state image pickup element according to the embodiment of the present invention, a positive charge accumulation region is formed in the vicinity of the interface (in the vicinity of the surface) of the semiconductor layer having the photodiode formed therein by forming the first film, the second film and the third film each containing therein the negative fixed charges. Therefore, the positive charges (holes) can be accumulated in the positive charge accumulation region. As a result, it is possible to suppress the generation of the dark current caused by the interface states. In addition, the sufficient negative bias effect is obtained by combining the first film, the second film and the third film with one another.

In addition, the semiconductor layer can be prevented from being damaged when the second film containing therein the negative fixed charges is formed by utilizing the physical vapor deposition method by the presence of the first film containing therein the negative fixed charges.

Moreover, such an element (such as hydrogen) as to reduce the negative bias effect can be prevented from being blocked from invasion thereof by the presence of the third film containing therein the negative fixed charges and formed by utilizing either the atomic layer deposition method or the metal organic chemical vapor deposition method. The reason for this is because the third film is formed by utilizing either the atomic layer deposition method or the metal organic chemical vapor deposition method, and thus is stronger in degree of the crystallization than the second film formed by utilizing the physical vapor deposition method, and is formed more densely.

According to another embodiment of the present invention, there is provided a method of manufacturing a solid-state image pickup element including the steps of: forming a photodiode in a semiconductor layer; forming a first film containing therein negative fixed charges on the semiconductor layer in a region in which at least the photodiode is formed by utilizing either an atomic layer deposition method or a metal organic chemical vapor deposition method; forming a second film containing therein the negative fixed charges on the first film containing therein the negative fixed charges by utilizing a physical vapor deposition method; and forming a third film containing therein the negative fixed charges on the second film containing therein the negative fixed charges by utilizing either the atomic layer deposition method or the metal organic chemical vapor deposition method.

In the method of manufacturing a solid-state image pickup element according to the another embodiment of the present invention, the first film containing therein the negative fixed charges is formed on the semiconductor layer in the region in which at least the photodiode is formed by utilizing either the atomic layer deposition method or the metal organic chemical vapor deposition method. As a result, the first film can be formed so as not to damage the semiconductor layer.

Also, since the first film is formed so as to underlie the second film, in forming the second film by utilizing the physical vapor deposition method, the semiconductor layer can be prevented from being damaged by the first film.

In addition, the third film is formed on the second film by utilizing either the atomic layer deposition method or the metal organic chemical vapor deposition method. Therefore, such an element (such as hydrogen) as to reduce the negative bias effect can be prevented from being blocked from the invasion thereof by the third film containing therein the negative fixed charges.

Also, the formation of the first film, the second film and the third film results in the structure allowing the positive charges (holes) to be accumulated in the vicinity of the interface (in the vicinity of the surface) of the semiconductor layer having the photodiode formed therein. As a result, it is possible to suppress the generation of the dark current caused by the interface states.

According to still another embodiment of the present invention, there is provided an image pickup device including: a condensing optical portion for condensing an incident light; a solid-state image pickup element including a semiconductor layer in which a photodiode for carrying out photoelectric conversion is formed, a first film containing therein negative fixed charges and formed on the semiconductor layer in a region in which at least the photodiode is formed by utilizing either an atomic layer deposition method or a metal organic chemical vapor deposition method, a second film containing therein the negative fixed charges and formed on the first film containing therein the negative fixed charges by utilizing a physical vapor deposition method, and a third film containing therein the negative fixed charges and formed on the second film containing therein the negative fixed charges by utilizing either the atomic layer deposition method or the metal organic chemical vapor deposition method, the solid-state image pickup element serving to receive the incident light condensed by the condensing optical portion to photoelectrically convert the incident light thus received into an electric signal; and a signal processing portion for processing the resulting electric signal obtained through the photoelectric conversion in the solid-state image pickup element.

In the image pickup device according to the still another embodiment of the present invention, since the solid-state image pickup element of the embodiment is incorporated in the configuration of the image pickup device of the still another embodiment, it is possible to suppress the generation of the dark current.

According to the solid-state image pickup element and the method of manufacturing the same of the present invention described above, the sufficient large negative bias effect makes it possible to suppress the generation of the dark current caused by the interface states.

Accordingly, it is possible to realize the solid-state image pickup element which operates stably without generating the dark current, and has the high reliability.

According to the image pickup device of the present invention described above, since it is possible to suppress the generation of the dark current in the solid-state image pickup element, the electric signal obtained through the photoelectric conversion in the solid-state image pickup element is stabilized.

Accordingly, it is possible to realize the image pickup device which operates stably and has the high reliability, and in which the excellent image quality is obtained.

DETAILED DESCRIPTION OF THE PREFERRED EMBODIMENTS

Figure 1:
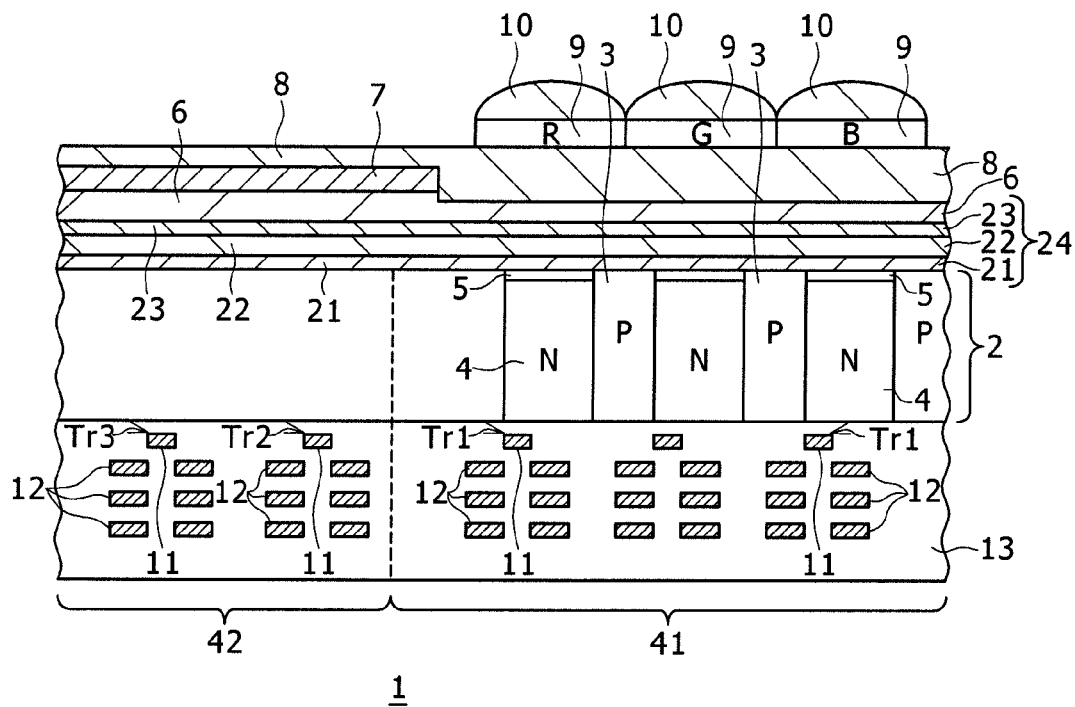
FIG. 1 is a schematic cross sectional view showing a structure of an embodiment of a solid-state image pickup element according to the present invention.

The preferred embodiments of the present invention will be described in detail hereinafter with reference to the accompanying drawings.

It is noted that the description will be given below in accordance with the following order.
1. Outline of the Present Invention
2. Solid-State Image Pickup Element
3. Method of Manufacturing Solid-State Image Pickup Element
4. Experiments (Measurements of Characteristics)
5. Image Pickup Device
1. Outline of the Present Invention In the present invention, a first film containing therein negative fixed charges is formed on a semiconductor layer in a region in which at least a photodiode of a solid-state image pickup element is formed, and a second film containing therein the negative fixed charges is formed on the first film. In addition, a third film containing therein the negative fixed charges is formed on the second film.

The first film is formed (deposited) by utilizing either an Atomic Layer Deposition (ALD) method or a Metal Organic Chemical Vapor Deposition (MOCVD) method.

The second film is formed (deposited) by utilizing a Physical Vapor Deposition (PVD) method.

Also, the third film is formed (deposited) by utilizing either the Atomic Layer Deposition (ALD) method or the Metal Organic Chemical Vapor Deposition (MOCVD) method.

A material which is selected from the group including a hafnium oxide ($HfO_2$), a zircon oxide ($ZrO_2$), an aluminum oxide ($Al_2O_3$), a titanium oxide ($TiO_2$), and a tantalum oxide ($Ta_2O_5$), for example, is given as each of the materials for the first film, the second film and the third film each containing therein the negative fixed charges. Since each of these oxide films has the past results of being used as a gate insulating film or the like of an insulated gate field-effect transistor, a method of depositing each of these oxide films is established and thus can be readily deposited.

In addition, in particular, when any one of $HfO_2$ (refractive index: 2.05), $Ta_2O_5$ (refractive index: 2.16), $TiO_2$ (refractive index: 2.20), and the like each having a relatively large refractive index of these oxide materials is used, it is also possible to obtain an antireflection effect.

An oxide of a rare earth element, for example, is given as a material other than materials described above. That is to say, there are given oxides of lanthanum, praseodymium, cerium, neodymium, promethium, samarium, europium, gadolinium, terbium, dysprosium, holmium, erbium, thulium, ytterbium, lutetium, and yttrium.

Moreover, it is also possible to use a hafnium nitride, an aluminum nitride, a hafnium oxynitride, or an aluminum oxynitride.

Silicon (Si) or nitrogen (N) may be added to each of the first film, the second film and the third film each containing therein the negative fixed charges as far as an insulating property of each of the first film, the second film and the third film is not impaired. A concentration of silicon (Si) or nitrogen (N) thus added is suitably determined as far as the insulating property of each of the first film, the second film and the third film is not impaired. Silicon (Si) or nitrogen (N) is added in such a manner, thereby making it possible to increase the thermal resistance of the film, and the ability to block the ion implantation in the process.

The first film containing therein the negative fixed charges, as described above, is deposited by utilizing either the Atomic Layer Deposition (ALD) method or the Metal Organic Chemical Vapor Deposition (MOCVD) method.

When the first film is deposited by utilizing the ALD method, for example, the deposition conditions are set in such a way that a substrate temperature is in the range of 200 to 500° C., a flow rate of precursor is in the range of 10 to 500 sccm, a period of time for radiation of the precursor is in the range of 1 to 15 sec, and a flow rate of $O_3$ is in the range of 5 to 50 sccm.

When the first film is deposited by utilizing the MOCVD method, for example, the substrate temperate is set in the range of 200 to 600° C.

It is noted that when the semiconductor layer is a silicon layer and the first film is deposited on the silicon layer by utilizing the ALD method, a silicon oxide for reducing the interface states can be formed on a surface of the silicon layer to have a thickness of about 1 nm concurrently with the formation of the first film.

The second film containing therein the negative fixed charges, as described above, is deposited by utilizing the Physical Vapor Deposition (PVD) method.

When the second film is deposited by utilizing the PVD method, for example, the deposition conditions are set in such a way that a pressure is in the range of 0.01 to 50 Pa, a D.C. power is in the range of 500 to 2,000 W, a flow rate of Ar is in the range of 5 to 50 sccm, and a flow rate of $O_2$ is in the range of 5 to 50 sccm.

Since the second film is deposited by utilizing the PVD method, a deposition rate is higher than that in the case of the ALD method or the MOCVD method. Thus, the second film having a certain degree of a thickness can be formed for a relatively short period of time.

The third film containing therein the negative fixed charges, as described above, is deposited by utilizing either the Atomic Layer Deposition (ALD) method or the Metal Organic Chemical Vapor Deposition (MOCVD) method.

When the third film is deposited by utilizing the ALD method, for example, the deposition conditions are set in such a way that the substrate temperature is in the range of 200 to 500° C., the flow rate of the precursor is in the range of 10 to 500 sccm, the period of time for radiation of the precursor is in the range of 1 to 15 sec, and the flow rate of $O_3$ is in the range of 5 to 50 sccm.

When the third film is deposited by utilizing the MOCVD method, for example, the deposition condition is set in such a way that the substrate temperature is in the range of 200 to 600° C.

Although the thickness of the first film containing therein the negative fixed charges is not especially limited, the first film has to have the thickness to some extent or more so as not to damage the semiconductor layer when the second film is formed by utilizing the PVD method. Preferably, the thickness of the first film is set as being equal to or larger than 1 nm.

In addition, it takes a lot of time to thickly form the first film because the first film is formed by utilizing either the ALD method or the MOCVD method. For this reason, the thickness of the first film is preferably set as being equal to or smaller than 5 nm.

In the present invention, the second film containing therein the negative fixed charges is formed on the first film containing therein the negative fixed charges, and the third film containing therein the negative fixed charges is formed on the second film. Therefore, the combination of the three films of the first film, the second film and the third film results in that the sufficient negative bias effect is obtained.

In addition, since the first film containing therein the negative fixed charges is formed by utilizing either the Atomic Layer Deposition (ALD) method or the Metal Organic Chemical Vapor Deposition (MOCVD) method, the semiconductor layer can be prevented from being damaged when the first film is formed.

Moreover, the first film containing therein the negative fixed charges has the negative fixed charges, and the semiconductor layer can be prevented from being damaged when the second film containing therein the negative fixed charges is formed.

Also, since the third film is formed by utilizing either the Atomic Layer Deposition (ALD) method or the Metal Organic Chemical Vapor Deposition (MOCVD) method, the third film is formed as a film which has the large degree of the crystallization, and is formed more densely. As a result, such an element (such as hydrogen) as to reduce the negative bias effect can be blocked from the invasion thereof by the third film.

In addition, when the second film is made of a material different from that of the first film, unlike the case of Patent Document 2, the two films made of the same material do not have to be laminated on top of each other by utilizing the two deposition methods. As a result, the limitations of the material for the film containing therein the negative fixed charges are relaxed, and the limitations of the characteristics of the material for the film containing therein the negative fixed charges are also relaxed.

Also, for example, $HfO_2$, $Ta_2O_5$ or $TiO_2$ having the relatively large refractive index is used as the material for the second film containing therein the negative fixed charges, whereby in addition to the antireflection effect described above, a quantity of light made incident to the photodiode is increased, thereby making it possible to increase the sensitivity.

In addition, when the first film and the third film are made of the same material, there is obtained an advantage that since the same deposition method (either the ALD method or the MOCVD method) is adopted for the two films of the first film and the third film, thereby making it possible to justify the film deposition condition, the manufacture becomes easy to carry out.

According to an embodiment of the present invention, it is possible to realize the solid-state image pickup element in which the generation of the dark current caused by the interface states can be suppressed by the sufficiently large negative bias effect, and thus which stably operates without generating the dark current, and has the high reliability.

Also, the image pickup device of the present invention is an image pickup device including the solid-state image pickup element of the present invention. As a result, the generation of the dark current can be suppressed in the solid-state image pickup element, and thus the electric signal obtained through the photoelectric conversion in the solid-state image pickup element is stabilized. Therefore, it is possible to realize the image pickup device which operates stably, and has the high reliability, and thus in which the excellent image quality is obtained.

2. Solid-State Image Pickup Element

FIG. 1 is a schematic cross sectional view showing a structure of an embodiment of a solid-state image pickup element according to the present invention.

This embodiment corresponds to the case where the present invention is applied to a so-called back surface radiation type CMOS solid-state image pickup element (CMOS image sensor).

In the CMOS solid-state image pickup element 1, charge accumulation regions 4 each becoming a photodiode are formed in the form of a light receiving portion for photoelectrically converting an incident light in a silicon substrate 2 in a photodiode portion 41 by N-type impurity regions.

Positive charge accumulation regions 5 are formed on surfaces of the charge accumulation regions 4 each becoming the photodiode, respectively.

Also, each of pairs of charge accumulation regions 4 and positive charge accumulating regions 5 composes the Hole Accumulation Diode (HAD) structure.

In the photodiode portion 41, gate electrodes 11 of MOS transistors Tr1 are formed below the charge accumulation regions 4 in the silicon substrate 2, respectively. Also, wiring layers 12 each composed of a metallic wiring are formed below the gate electrodes 11 of the MOS transistors Tr1, respectively. In FIG. 1, the wiring layers 12 of three levels are formed below each of the gate electrodes 11 of the MOS transistors Tr1. An interlayer insulating layer 13 insulates between the gate electrodes 11 and the uppermost wiring layers 12, and between the wirings in each adjacent two levels.

It is noted that although not illustrated, the interlayer insulating layer 13 is suppressed by a supporting substrate or the like provided below the interlayer insulating layer 13.

Pixels are composed of the photodiodes each having the three charge accumulation regions 4, respectively.

Each of the pixels is composed so as to have one or more transistors, including the three MOS transistors Tr1 shown in FIG. 1 (the three MOS transistors Tr1 for reading out and transferring the charges accumulated in the three charge accumulation regions 4, respectively).

A P-type isolation region 3 separates between each adjacent two charge accumulation regions 4 in each of the pixels.

It is noted that although not illustrated, preferably, a $p^+$-type semiconductor region is formed in an interface on each of the gate electrode 11 sides of the transistors Tr1 in the charge accumulation regions 4, thereby suppressing the generation of the dark current in the interface with the interlayer insulating layer 13.

MOS transistors Tr2 and Tr3 composed of N-channel and P-channel MOS transistors are formed in a peripheral circuit portion 42.

Although not illustrated, source and drain regions of the MOS transistors Tr2 and Tr3, and a semiconductor well region becoming channels of the MOS transistors Tr2 and Tr3 are formed within the silicon substrate 2.

A film 24 containing therein the negative fixed charges is formed so as to overlie the silicon substrate 2 having the three photodiodes formed therein.

By the negative fixed charges contained in the film 24 containing therein the negative fixed charges, an electric field is applied to each of the surfaces of the charge accumulation regions 4, thereby forming a positive charge accumulation region (hole accumulation region) 5 in each of the surfaces of the charge accumulation regions 4. As a result, even when impurity ions are not implanted into each of the surfaces of the charge accumulation regions 4, each of the positive charge accumulation regions 5 can be formed.

An insulating film, for example, formed from a $SiO_2$ film is formed on the film 24 containing therein the negative fixed charges. A light blocking film 7 is partially formed on the insulating film 6 so as to cover a part of the photodiode portion 41, and the peripheral circuit portion 42.

A region (an optical black region (not shown)) in which a light is not made incident to each of the photodiodes is made by the light blocking film 7, and a black level in an image can be determined in accordance with output signals from the photodiodes.

In addition, in the peripheral circuit portion 42, fluctuations of the characteristics of the MOS transistors Tr2 and Tr3, and the like due to incidence of the light can be suppressed by the light blocking film 7.

A planarizing film 8 is formed so as to cover the $SiO_2$ film 6 and the light blocking film 7.

Color filters 9 having corresponding colors (red (R), green (G), and blue (B)) are formed every pixel on the planarizing film 8.

On-chip lenses 10 for light condensing are provided on the color filters 9, respectively.

By adopting such a structure, in the CMOS solid-state image pickup element 1 of this embodiment, the light is made incident from an upper side in FIG. 1 to the CMOS solid-state image pickup element 1 to cause the photoelectric conversion in each of the charge accumulation regions 4 of the respective photodiodes, thereby making it possible to receive and detect the incident light.

Also, the light is made incident from the upper layer on a side (on a back surface side) opposite to a side (a front surface side) of the wiring layers 12 each of which is located in the lower layer when viewed from the silicon substrate 2 having the photodiodes formed therein. Thus, the CMOS solid-state image pickup element 1 of this embodiment has the so-called back surface radiation type structure.

In the CMOS solid-state image pickup element 1 of this embodiment, in particular, the film 24 containing therein the negative fixed charges has a lamination structure of three layers, that is, a first film 21 as the lowermost layer containing therein the negative fixed charges, a second film 22 as a middle layer containing therein the negative fixed charges, and a third layer 23 as the uppermost layer containing therein the negative fixed charges.

The first film 21 is deposited by utilizing either the ALD method or the MOCVD method, the second layer 22 is deposited by utilizing the PVD method, and the third film 23 is deposited by utilizing either the ALD method or the MOCVD method.

An oxide which is selected from the group including $HfO_2$, $ZrO_2$, $Al_2O_3$, $TiO_2$, and $Ta_2O_5$, for example, can be used as each of the materials for the first film 21, the second film 22, and the third film 23 each containing therein the negative fixed charges. In addition, any of the nitrides, the oxynitrides, the oxides of the rare earth elements as described above, or the like can also be used.

Figure 15A:
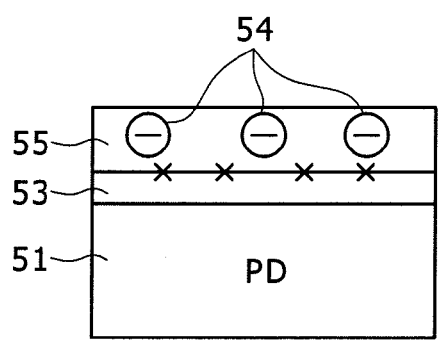
FIGS. 15A and 15B are respectively a schematic cross sectional view and an energy diagram each explaining the case where an insulating layer containing therein negative fixed charges is formed on a silicon layer having a photodiode formed therein.
Figure 15B:
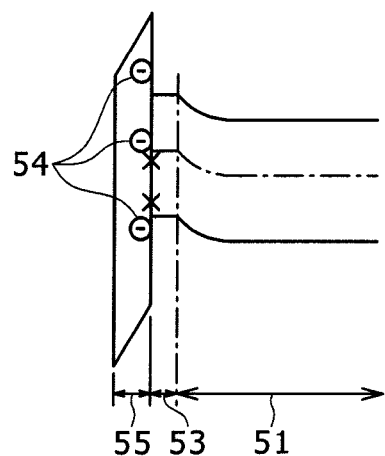

The film 24 (including the first film 21, the second film 22 and the third film 23) containing therein the negative fixed charges is formed on the silicon substrate 2, whereby similarly to the case shown in FIGS. 15A and 15B, an energy band of the film 24 is bent to allow the positive charges (holes) to be accumulated in the vicinity of an interface between the silicon substrate 2 and the film 24.

It is noted that when any one of $HfO_2$ film, the $Ta_2O_5$ film and $TiO_2$ film, and the like each having the relatively large refractive index is formed as each of the first film 21, the second film 22 and the third film 23 each containing therein the negative fixed charges, it is also possible to obtain the antireflection effect.

3. Method of Manufacturing Solid-State Image Pickup Element

An embodiment of a method of manufacturing the CMOS solid-state image pickup element 1 will be described in detail hereinafter with reference to FIGS. 2 to 10.

Figure 2:
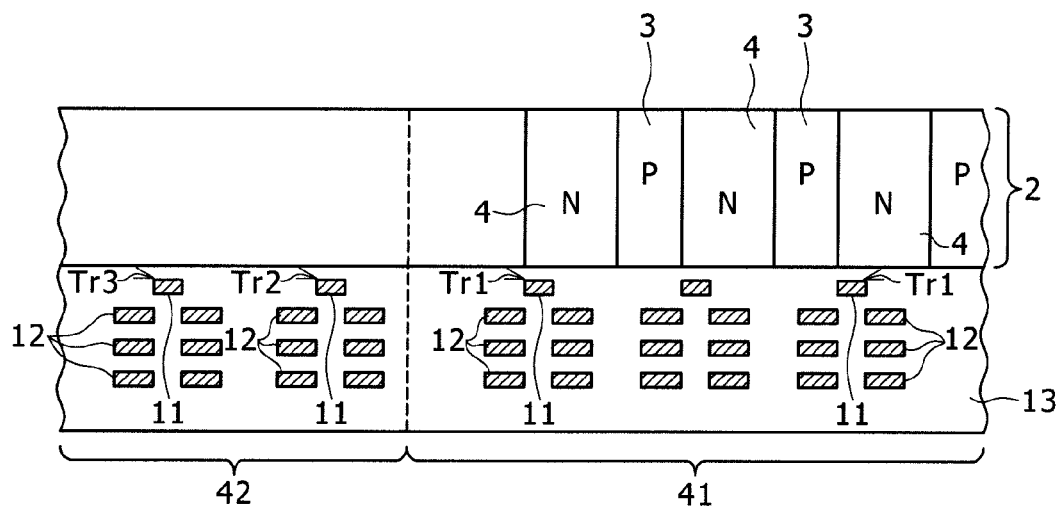
FIGS. 2 to 10 are respectively schematic cross sectional views explaining respective processes for manufacturing the solid-state image pickup element shown in FIG. 1.

The description will now be started with a state in which as shown in FIG. 2, the charge accumulation regions 4 are formed within the silicon substrate 2 in the photodiode portion 41, and the gate electrodes 11 of the MOS transistors Tr1, Tr2 and Tr3, and the wiring layers 12 of the three levels are formed in the interlayer insulating layer 13.

Figure 3:
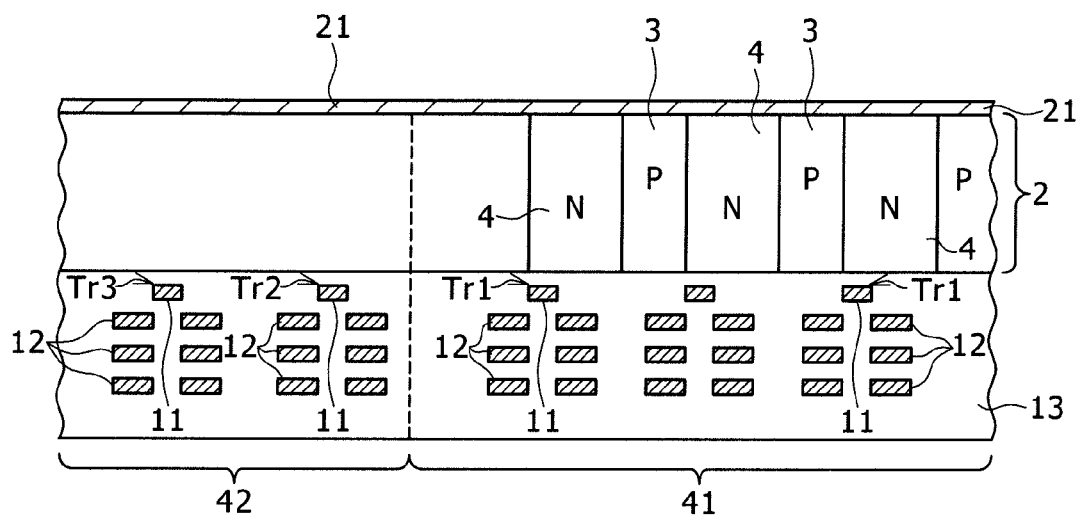

Firstly, as shown in FIG. 3, the first film 21 containing therein the negative fixed charges is formed on the silicon substrate 2 having the charge accumulation regions 4 formed therein by utilizing either the ALD method or the MOCVD method. In addition, $HfO_2$, $ZrO_2$, $Al_2O_3$, $TiO_2$, or $Ta_2O_5$, for example, is given as the material for the first film 21 containing therein the negative fixed charges.

The film deposition conditions when the first film 21 is formed by utilizing the ALD method, for example, are set in such a way that the substrate temperature for the film deposition is in the range of 200 to 500° C., the flow rate of the precursor is in the range of 10 to 500 sccm, the period of time for the radiation of the precursor is in the range of 1 to 15 sec, and the flow rate of $O_3$ is in the range of 10 to 500 sccm.

The thickness of the first film 21 is preferably set as being equal to or larger than 1 nm.

It is noted that when the first film 21 is deposited by utilizing the ALD method, a silicon oxide film (having the thickness of about 1 nm) is formed on the surface of the silicon substrate 2 concurrently with the deposition of the first film 21 in some cases.

Figure 4:
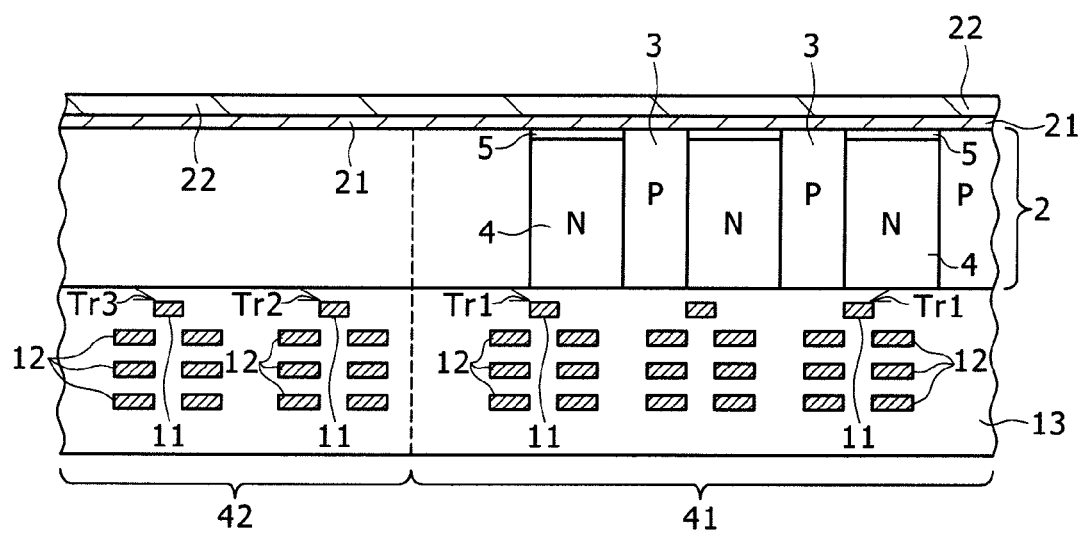

Next, as shown in FIG. 4, the second film 22 containing therein the negative fixed charges is formed on the first film 21 containing therein the negative fixed charges by utilizing the PVD method. In addition, $HfO_2$, $ZrO_2$, $Al_2O_3$, $TiO_2$, or $Ta_2O_5$, for example, is given as the material for the second film 22 containing therein the negative fixed charges.

The film deposition condition when the second film 22 is deposited by utilizing the PVD method, for example, is set in such a way that the pressure is in the range of 0.01 to 50 Pa, the D.C. power is in the range of 500 to 2,000 W, the flow rate of Ar is in the range of 5 to 50 sccm, and the flow rate of $O_2$ is in the range of 5 to 50 sccm.

Figure 5:
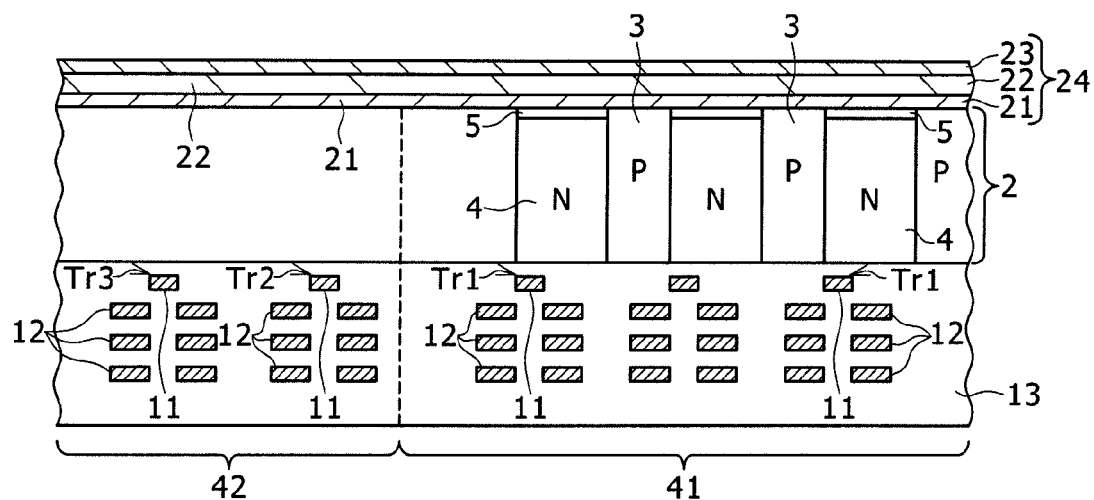

Next, as shown in FIG. 5, the third film 23 containing therein the negative fixed charges is formed on the second film 22 containing therein the negative fixed charges by utilizing either the ALD method or the MOCVD method. In addition, $HfO_2$, $ZrO_2$, $Al_2O_3$, $TiO_2$, or $Ta_2O_5$, for example, is given as the material for the third film 23 containing therein the negative fixed charges.

The film deposition condition when the third film 23 is deposited by utilizing the ALD method, for example, is set in such a way that the substrate temperature for the film deposition is in the range of 200 to 500° C., the flow rate of the precursor is in the range of 10 to 500 sccm, the period of time for the radiation of the precursor is in the range of 1 to 15 sec, and the flow rate of $O_3$ is in the range of 10 to 500 sccm.

The thickness of the third film 23 is preferably set as being equal to or larger than 1 nm, and is more preferably set as being equal to or larger than 3 nm so as to allow the element for reducing the negative bias effect to be sufficiently blocked from the invasion thereof.

The second film 22 containing therein the negative fixed charges is formed on the first film 21 containing therein the negative fixed charges, and the third film 23 containing therein the negative fixed charges is formed on the second film 22 containing therein the negative fixed charges, thereby structuring the film 24 containing therein the negative fixed charges, and having the first film 21, the second film 22 and the third film 23 laminated one upon another. By structuring the film 24 containing therein the negative fixed charges, the positive charge accumulation regions 5 are formed on the surfaces of the charge accumulation regions 4, respectively.

Figure 6:
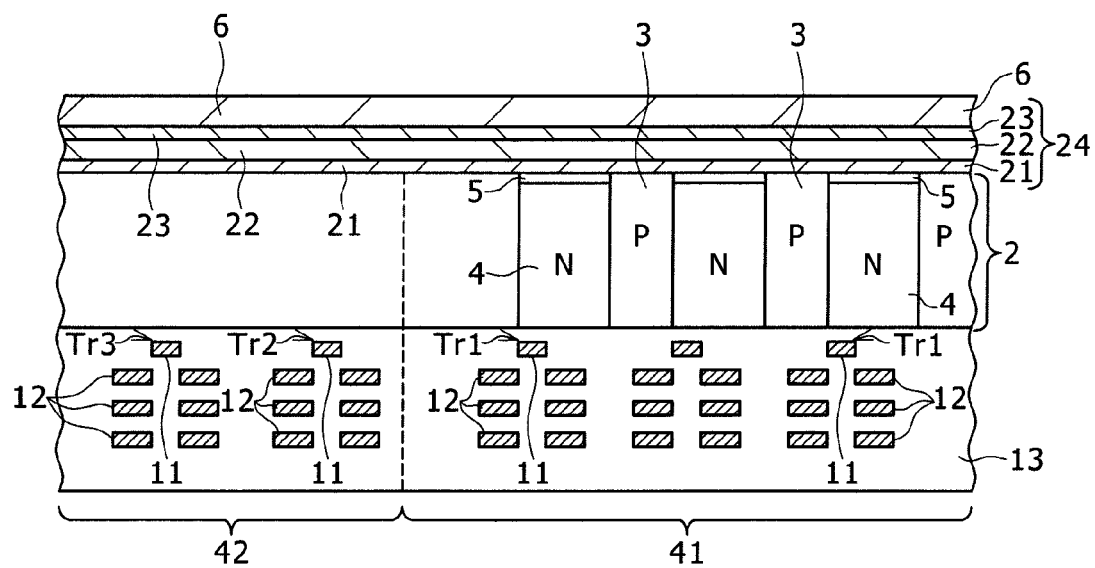

Next, as shown in FIG. 6, the insulating film 6 such as the $SiO_2$ film is formed on the third film 23 containing therein the negative fixed charges.

The formation of the insulating film 6 makes it possible to prevent the surface of the third film 23 containing therein the negative fixed charges from being directly exposed to the etching atmosphere during the later etching for the light blocking film 7. In addition, it is possible to suppress a reaction between the third film 23 containing therein the negative fixed charges and the light blocking film 7 resulting from the direct contact between the third film 23 containing therein the negative fixed charges and the light blocking film 7.

Figure 7:
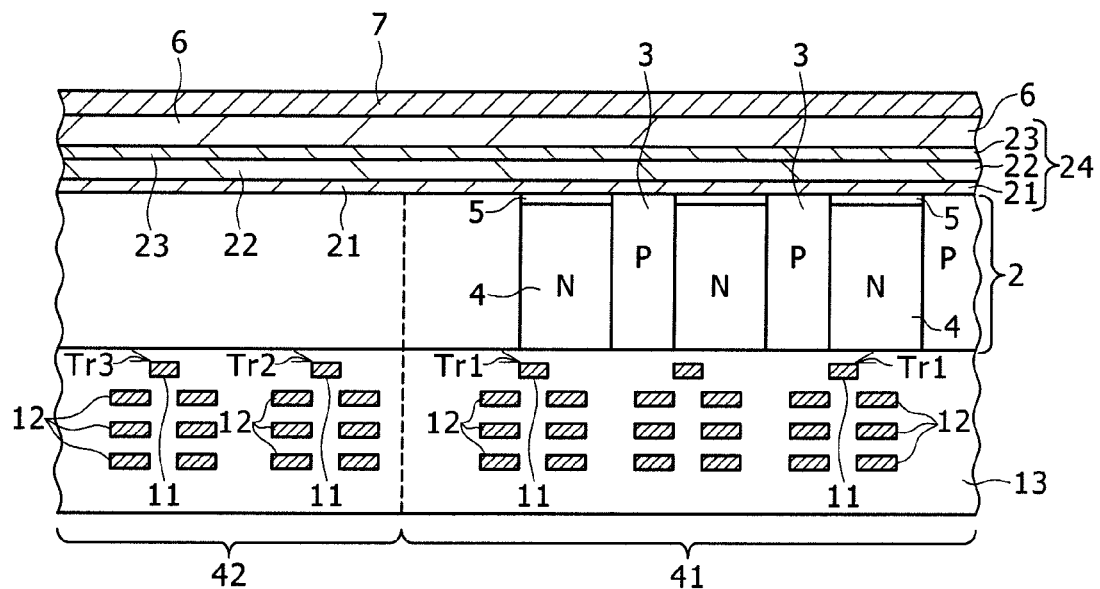

Next, as shown in FIG. 7, a metallic film becoming the light blocking film 7 is formed on the insulating film 6.

Figure 8:
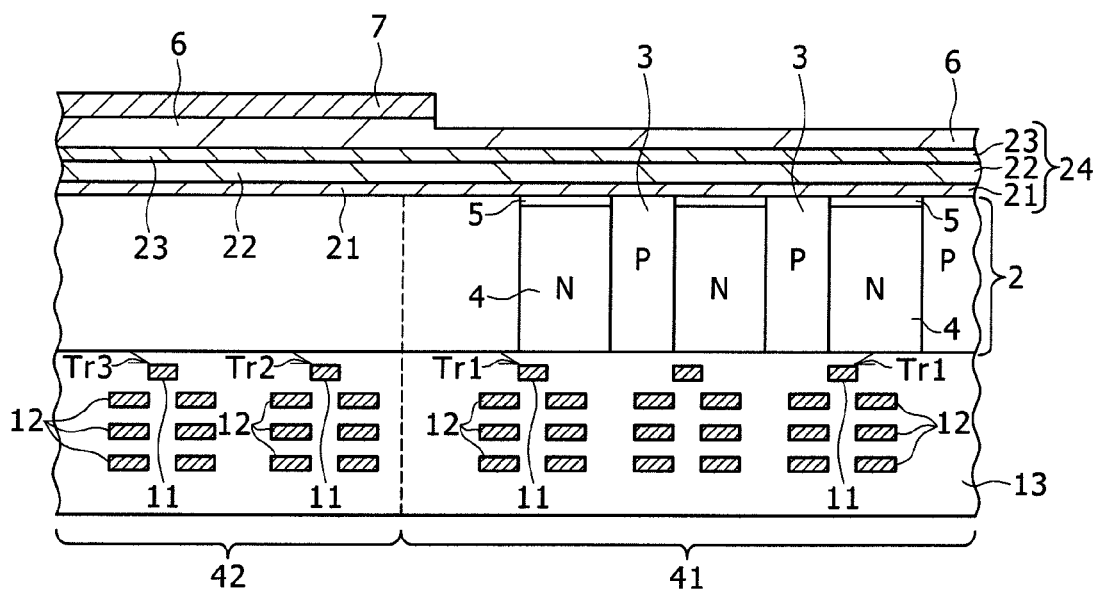

In addition, as shown in FIG. 8, upper portions of the light blocking film 7 and the insulating film 6 are partially, selectively processed by carrying out etching. As a result, the light blocking film 7 is left on a part of the photodiode portion 41, and on the peripheral circuit portion 42.

Figure 9:
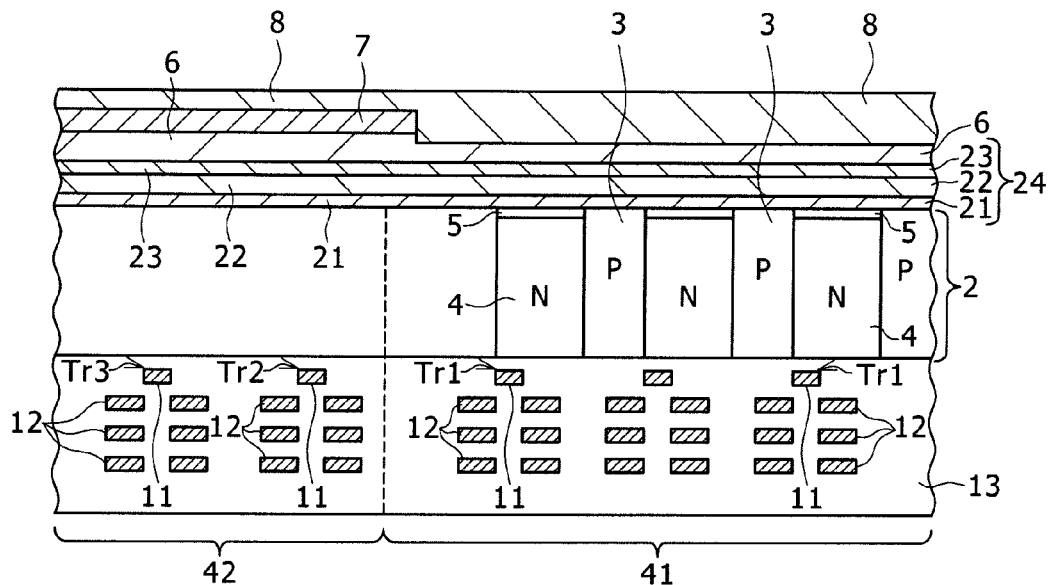

Next, as shown in FIG. 9, the planarizing film 8 is formed so as to cover the surfaces of the insulating film 6 and the light blocking film 7. A $SiO_2$ film, for example, is formed as the planarizing film 8 by utilizing an application method. The planarizing film 8 is formed to have a sufficient thickness, whereby a stepped portion caused by formation of the light blocking film 7 is eliminated, thereby making it possible to planarize the surface.

Figure 10:
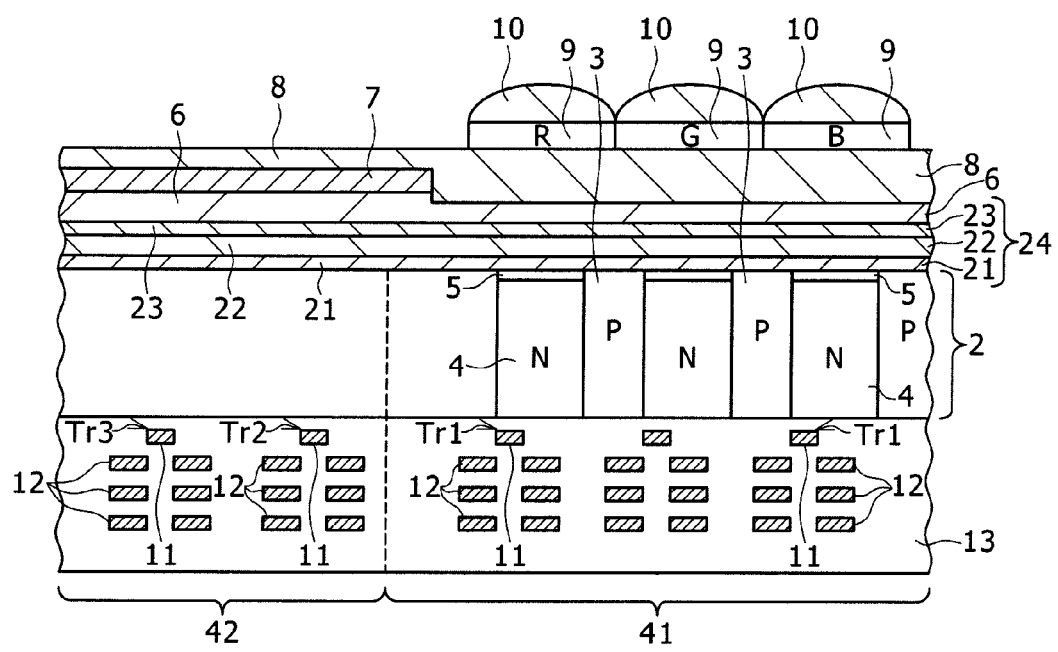

Finally, as shown in FIG. 10, the color filters 9 and the on-chip lenses 10 are formed in order above the respective photodiodes in each of the pixels in the photodiode portion 41.

It is noted that for the purpose of preventing the processing damage from being applied to the color filters 9 during the lens processing, a light-permeable insulating film (not shown) may be formed between the color filters 9 and the on-chip lenses 10.

The CMOS solid-state image pickup element 1 shown in FIG. 1 can be manufactured in the manner described above.

According to the embodiment of the solid-state image pickup element 1, and the embodiment of the method of manufacturing the solid-state image pickup element 1, the first film 21 containing therein the negative fixed charges is formed on the silicon substrate 2, in the photodiode portion 41, which has the charge accumulation regions 4 formed therein by utilizing either the ALD method or the MOCVD method. Also, the second film 22 containing therein the negative fixed charges is formed on the first film 21 containing therein the negative fixed charges by utilizing the PVD method. In addition, the third film 23 containing therein the negative fixed charges is formed on the second film 22 containing therein the negative fixed charges by utilizing either the ALD method or the MOCVD method. As a result, there is structured the film 24 containing therein the negative fixed charges and including the first film 21, the second film 22 and the third film 23 laminated one upon another.

The sufficient negative bias effect is obtained by combining the first film 21, the second film 22 and the third film 23 each containing therein the negative fixed charges with one another. The energy band of the film 24 including the first film 21, the second film 22 and the third film 23 can be bent similarly to the existing case shown in FIGS. 15A and 15B by the negative fixed charges contained in the first film 21, the second film 22 and the third film 23. As a result, the positive charge accumulation regions 5 are formed in the vicinity of the interface between the silicon substrate 2 and the film 24 to allow the positive charges (holes) to be accumulated therein, thereby making it possible to suppress the generation of the dark current caused by the interface states.

Since the first film 21 containing therein the negative fixed charges is formed by utilizing either the ALD method or the MOCVD method, the silicon substrate 2 can be prevented from being damaged when the first film 21 is formed in such a manner.

In addition, since the first film 21 is formed so as to underlie the second film 22 containing therein the negative fixed charges, the silicon substrate 2 can be prevented from being damaged by the first film 21 when the second film 22 containing therein the negative fixed charges is formed by utilizing the PVD method.

Also, since the third film 23 containing therein the negative fixed charges is formed by utilizing either the ALD method or the MOCVD method, the third film 23 is formed which has the large degree of crystallization and which is more dense. As a result, such an element (such as hydrogen) as to reduce the negative bias effect can be blocked from the invasion thereof by the third film 23.

Therefore, according to the embodiment of the solid-state image pickup element 1, and the embodiment of the method of manufacturing the solid-state image pickup element 1, it is possible to realize the solid-state image pickup element 1 in which the generation of the dark current caused by the interface states can be suppressed by the sufficient large negative bias effect, and thus which stably operates without generating the dark current, and has the high reliability.

It is noted that when the first film 21 containing therein the negative fixed charges, and the second film 22 containing therein the negative fixed charges are made of the different materials, unlike the case of Patent Document 2, the two films made of the same material do not have to be laminated on top of each other by utilizing the two deposition methods. As a result, the limitations of the material(s) for the film 24 (including the first film 21, the second film 22 and the third film 23) containing therein the negative fixed charges are relaxed, and the limitations of the characteristics of the film 24 (including the first film 21, the second film 22 and the third film 23) containing therein the negative fixed charges are also relaxed.

On the other hand, when the first film 21 containing therein the negative fixed charges, and the third film 23 containing therein the negative fixed charges are made of the same material, there is obtained an advantage that since the same deposition method (either the ALD method or the MOCVD method) is adopted for the two films of the first film 21 and the third film 23, thereby making it possible to justify the film deposition condition. As a result, the manufacture becomes easy to carry out.

It should be noted that the charge accumulation ranges composing the respective photodiodes may be formed in a silicon epitaxial layer on a silicon substrate instead of forming the charge accumulation ranges 4 composing the respective photodiodes in the silicon substrate 2 in the manner as shown in FIG. 1.

In addition, the structures of the insulating film 6, the light blocking film 7 and the planarizing film 8 each overlying the third film 23 containing therein the negative fixed charges, and the structure of the peripheral circuit portion 42 are by no means limited to those in the embodiment of the solid-state image pickup element 1 described above, and thus various kinds of changes may also be made.

For example, it is also possible to adopt the structure which is described in the embodiment in Patent Document 2.

Although the embodiment described above corresponds to the case where the present invention is applied to the CMOS solid-state image pickup element, the present invention can also be applied to any of solid-state image pickup elements having other structures.

For example, the present invention is applied to a CCD solid-state image pickup element. In this case, a silicon oxide film is formed on a light receiving portion by using plasma and a film containing therein the negative fixed charges is also formed thereon, thereby making it possible to suppress the generation of the dark current caused by the interface states.

Also, the embodiment described above corresponds to the case where the present invention is applied to the solid-state image pickup element having the back surface radiation type structure.

However, the present invention can also be applied to a solid-state image pickup element having a so-called front surface radiation type structure in which wiring layers and transfer electrodes are formed on a light incidence side of a semiconductor layer having a photodiode formed therein.

4. Experiments (Measurements of Characteristics)

The solid-state image pickup element of the present invention was actually manufactured and the characteristics thereof were checked.

The solid-state image pickup element 1 shown as the embodiment of the present invention shown in FIG. 1 was manufactured. A $HfO_2$ film was used as each of the first film 21, the second film 22 and the third film 23 each containing therein the negative fixed charges, and composing the film 24 containing therein the negative fixed charges. In this case, each of the first film 21 and the third film 23 was deposited by utilizing the ALD method. A silicon oxide film was formed as the insulating film 6 overlying the film 24 containing therein the negative fixed charges by utilizing a High Density Plasma (HDP) method.

On the other hand, a solid-state image pickup element in which the second film 22 was thickly formed instead of forming the third film 23, thereby making the total thickness of the films, i.e., the first film 21 and the thicker second film 22 each containing therein the negative fixed charges equal to that of the first film 21, the second film 22 and the third film 23 in the embodiment of the CMOS solid-state image pickup element 1, and other constituent elements have the same structure as that in the embodiment of the CMOS solid-state image pickup element 1 was manufactured as a comparative example.

When the situation of generation of the dark current in the CMOS solid-state image pickup element 1 of the embodiment was compared with that in the CMOS solid-state image pickup element of the comparative example under the same conditions, the generation of the dark current was clearly further suppressed in the CMOS solid-state image pickup element 1 of the embodiment than in the CMOS solid-state image pickup element of the comparative example.

In addition, the concentrations of hydrogen of the first film 21, the second film 22 and the third film 23 in the CMOS solid-state image pickup element 1 of the embodiment were measured, and the concentrations of hydrogen of the first film 21 and the thicker second film 22 in the CMOS solid-state image pickup element of the comparative example were also measured. As a result, in particular, the concentration of hydrogen of the second film 22 containing therein the negative fixed charges differs significantly between the CMOS solid-state image pickup element 1 of the embodiment, and the CMOS solid-state image pickup element of the comparative example. That is to say, the concentration of hydrogen is less in the CMOS solid-state image pickup element 1 of the embodiment than in the CMOS solid-state image pickup element of the comparative example.

Figure 11A:
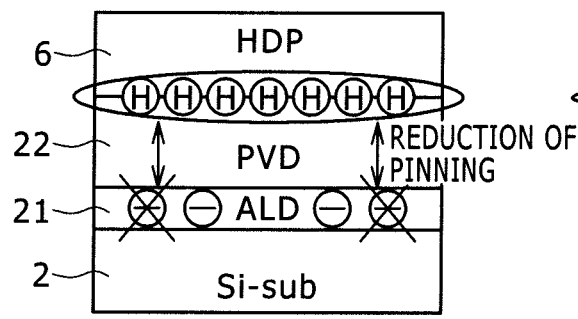
FIGS. 11A and 11B are respectively a schematic cross sectional view showing a model obtained by guessing a phenomenon occurring in a solid-state image pickup element of a comparative example, and a schematic cross sectional view showing a model obtained by guessing a phenomenon occurring in the solid-state image pickup element of the embodiment shown in FIG. 1.
Figure 11B:
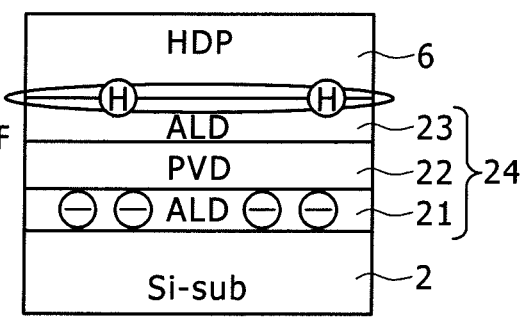

Models which are obtained by guessing the phenomena occurring in the CMOS solid-state image pickup element 1 of the embodiment and the CMOS solid-state image pickup element of the comparative example, respectively, from those experimental results are shown in FIGS. 11A and 11B, respectively. FIG. 11A is a schematic cross sectional view showing the model in the case of the CMOS solid-state image pickup element of the comparative example, and FIG. 11B is a schematic cross sectional view showing the model in the case of the CMOS solid-state image pickup element 1 of the embodiment.

It is thought that in the case of the CMOS solid-state image pickup element of the comparative example, a large amount of hydrogen invades from the insulating layer (HDP) 6 as the upper layer into the thicker second film 22 containing therein the negative fixed charges. It is also thought that hydrogen cancels the negative fixed charges as indicated by two-headed arrows through a mutual interaction with the negative fixed charges, thereby reducing pinning (negative bias effect).

On the other hand, in the case of the CMOS solid-state image pickup element of the embodiment, it is thought that the third film 23 is formed by utilizing the ALD method, thereby making it possible to suppress the invasion of hydrogen into the film 24 containing therein the negative fixed charges. This is guessed as follows. That is to say, the film is more densely formed in the film deposition by utilizing the ALD method than in the film deposition by utilizing the PVD method. As a result, the total amount of negative fixed charges can be increased without canceling the effect of the lamination of the first film 21, the second film 22 and the third film 23 each containing therein the negative fixed charges, and composing the film 24 containing therein the negative fixed charges by the invasion of hydrogen.

5. Image Pickup Device

Next, an embodiment of an image pickup device of the present invention will be described in detail with reference to FIG. 12.

Figure 12:
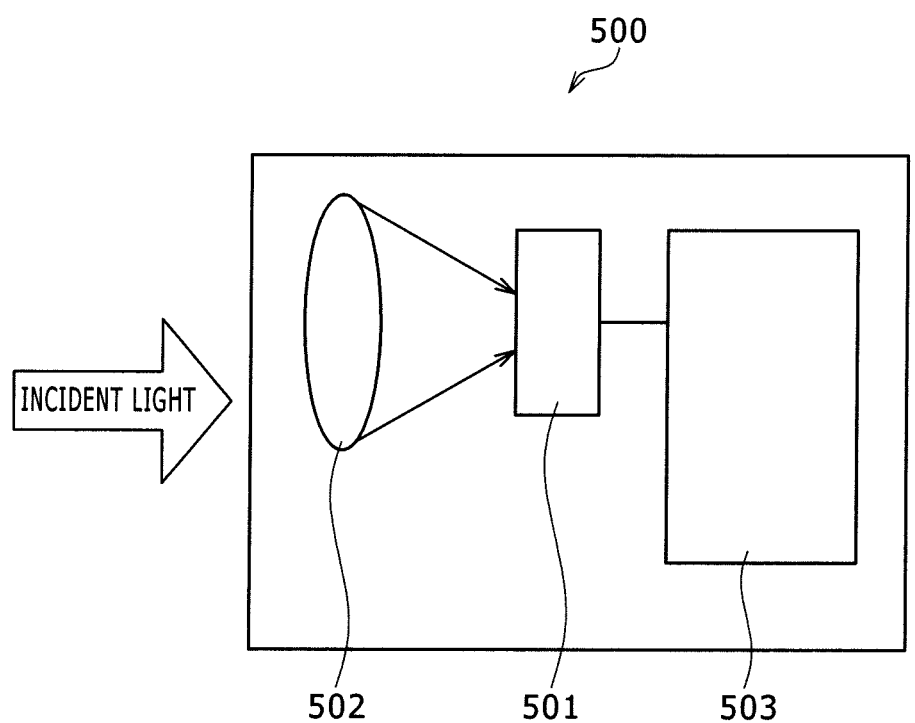
FIG. 12 is a schematic block diagram showing a configuration of an embodiment of an image pickup device according to the present invention.
Figure 13A:
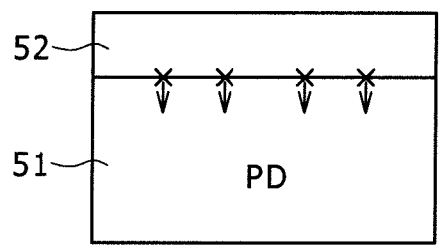
FIGS. 13A and 13B are respectively a schematic cross sectional view and an energy diagram each explaining the case where an insulating layer is formed on a silicon layer having a photodiode formed therein.
Figure 13B:
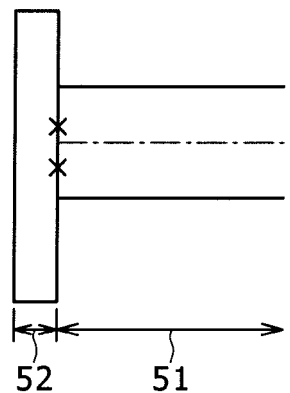
Figure 14A:
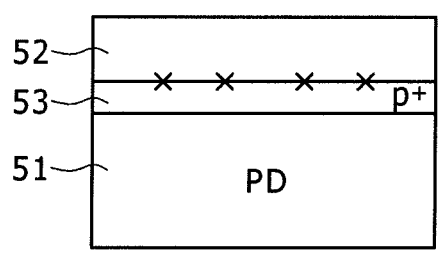
FIGS. 14A and 14B are respectively a schematic cross sectional view and an energy diagram each explaining the case where a $p^+$-type semiconductor region is formed to obtain an HAD structure.
Figure 14B:
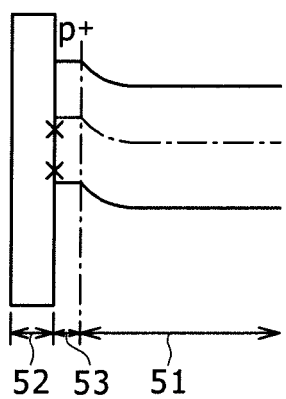

FIG. 12 is a schematic block diagram showing a configuration of the embodiment of the image pickup device of the present invention.

A video camera, a digital still camera, a camera of a mobile phone, or the like, for example, is given as the image pickup device.

As shown in FIG. 12, the image pickup device 500 includes an image pickup portion 501 having a solid-state image pickup element (not shown). An imaging optical system 502 for condensing an incident light to image an image corresponding to the incident light is provided in a preceding stage of the image pickup portion 501. In addition, a signal processing portion 503 in a subsequent stage of the image pickup portion 501 is connected to the image pickup portion 501. In this case, the signal processing portion 503 includes a driving circuit for driving the image pickup portion 501, a signal processing circuit for processing an electric signal obtained through the photoelectric conversion in the solid-state image pickup element into an image signal corresponding to the electric signal, and the like. In addition, the image signal obtained through the processing in the signal processing portion 503 can be stored in an image storage portion (not shown).

The embodiment of the CMOS solid-state image pickup element 1 described above according to an embodiment of the present invention is used as the solid-state image pickup element in such an image pickup device 500. Here, the CMOS solid-state image pickup element 1, as previously stated, includes the semiconductor layer 2 in which the photodiode for carrying out the photoelectric conversion is formed, the first film 21 containing therein the negative fixed charges and formed on the semiconductor layer 2 in the region in which at least the photodiode is formed by utilizing either the atomic layer deposition method or the metal organic chemical vapor deposition method, the second film 22 containing therein the negative fixed charges and formed on the first film 21 containing therein the negative fixed charges by utilizing the physical vapor deposition method, and the third film 23 containing therein the negative fixed charges and formed on the second film 22 containing therein the negative fixed charges by utilizing either the atomic layer deposition method or the metal organic chemical vapor deposition method.

According to the embodiment of the image pickup device 500 of the present invention, the solid-state image pickup element 1 described above is used in which the generation of the dark current is suppressed by the sufficient negative bias effect. Therefore, there is obtained an advantage that an image of high grade can be recorded.

It should be noted that the image pickup device of the present invention is by no means limited to the configuration shown in FIG. 12, and thus the present invention can be applied to any of the image pickup devices as long as the image pickup device concerned uses the solid-state image pickup element of the present invention.

For example, the solid-state image pickup element may have a form in which the solid-state image pickup element is formed as one chip, or may have a module-like form in which the image pickup portion, and the signal processing portion or the optical system are collectively packaged.

The image pickup device of the present invention can be applied to any of the various kinds of image pickup devices such as a camera and a mobile device having an image capturing function. In addition, the image pickup device of the present invention includes a fingerprint detecting device in terms of the broad sense of "image pickup."

The present invention is by no means limited to the embodiments described above, and thus other various kinds of constitutions can be adopted without departing from the subject matter of the present invention.

The present application contains subject matter related to that disclosed in Japanese Priority Patent Application JP 2009-180901 filed in the Japan Patent Office on Aug. 3, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup element, comprising:
a semiconductor layer in which a photodiode for carrying out photoelectric conversion is formed;
a positive charge accumulation region in the semiconductor layer and a plurality of films formed directly above the positive charge accumulation region, the films including:
a first film containing negative fixed charges and formed on said semiconductor layer in a region in which at least said photodiode is formed by utilizing either an atomic layer deposition method or a metal organic chemical vapor deposition method;
a second film containing the negative fixed charges and formed on said first film containing therein the negative fixed charges by utilizing a physical vapor deposition method; and
a third film containing the negative fixed charges and formed on said second film containing therein the negative fixed charges by utilizing either the atomic layer deposition method or the metal organic chemical vapor deposition method.

2. The solid-state image pickup element according to claim 1,
wherein each of said first film containing the negative fixed charges, and said third film containing the negative fixed charges is made of a material selected from the group including $HfO_2$, $ZrO_2$, $Al_2O_3$, $TiO_2$, and $Ta_2O_5$.

3. The solid-state image pickup element according to claim 1,
wherein said second film containing the negative fixed charges is made of a material selected from the group including $HfO_2$, $ZrO_2$, $Al_2O_3$, $TiO_2$, and $Ta_2O_5$.

4. A method of manufacturing a solid-state image pickup element, comprising the steps of:
forming a photodiode in a semiconductor layer;
forming a first film containing negative fixed charges directly on said semiconductor layer in a region in which at least said photodiode is formed by utilizing either an atomic layer deposition method or a metal organic chemical vapor deposition method;
forming a second film containing the negative fixed charges directly on said first film containing the negative fixed charges by utilizing a physical vapor deposition method; and
forming a third film containing the negative fixed charges directly on said second film containing the negative fixed charges by utilizing either the atomic layer deposition method or the metal organic chemical vapor deposition method wherein the first, second and third films are formed between a charge accumulation region in the semiconductor layer and a light receiving lens.

5. The method of manufacturing a solid-state image pickup element according to claim 4,
wherein a material selected from the group including $HfO_2$, $ZrO_2$, $Al_2O_3$, $TiO_2$, and $Ta_2O_5$ is used as each of materials for said first film containing the negative fixed charges, and said third film containing the negative fixed charges.

6. The method of manufacturing a solid-state image pickup element according to claim 4,
wherein a material selected from the group including $HfO_2$, $ZrO_2$, $Al_2O_3$, $TiO_2$, and $Ta_2O_5$ is used as a material for said second film containing the negative fixed charges.

7. An image pickup device, comprising:
a condensing optical portion for condensing an incident light;
a solid-state image pickup element including a semiconductor layer in which a photodiode for carrying out photoelectric conversion is formed, a first film containing negative fixed charges and formed on said semiconductor layer in a region in which at least said photodiode is formed by utilizing either an atomic layer deposition method or a metal organic chemical vapor deposition method, a second film containing the negative fixed charges and formed on said first film containing the negative fixed charges by utilizing a physical vapor deposition method, and a third film containing the negative fixed charges and formed on said second film containing the negative fixed charges by utilizing either the atomic layer deposition method or the metal organic chemical vapor deposition method, said solid-state image pickup element serving to receive the incident light condensed by said condensing optical portion to photoelectrically convert the incident light thus received into an electric signal; and a signal processing portion for processing the resulting electric signal obtained through the photoelectric conversion in said solid-state image pickup element wherein the first, second and third films are formed between a charge accumulation region in the semiconductor layer and a light receiving lens.

\* \* \* \* \*